US008259772B2

(12) United States Patent
Krahne et al.

(10) Patent No.: US 8,259,772 B2
(45) Date of Patent: Sep. 4, 2012

(54) FABRICATION OF LASING MICROCAVITIES CONSISTING OF HIGHLY LUMINESCENT COLLOIDAL NANOCRYSTALS

(75) Inventors: Roman Krahne, Genoa (IT); Liberato Manna, Genoa (IT); Margherita Zavelani-Rossi, Milan (IT); Guglielmo Lanzani, Milan (IT); Salvatore Girardo, Surbo (IT); Dario Pisignano, Lecce (IT); Maria Grazia Lupo, Liscate (IT)

(73) Assignee: Fondazione Istituto Italiano di Technologia, Genoa (IT)

( * ) Notice: Subject to any disclaimer, the term of this patent is extended or adjusted under 35 U.S.C. 154(b) by 57 days.

(21) Appl. No.: 13/021,221

(22) Filed: Feb. 4, 2011

(65) Prior Publication Data

US 2012/0201265 A1 Aug. 9, 2012

(51) Int. Cl.
*H01S 3/06* (2006.01)
(52) U.S. Cl. ................ 372/66; 372/41; 372/44
(58) Field of Classification Search .......... 372/41, 372/66
See application file for complete search history.

(56) References Cited

U.S. PATENT DOCUMENTS

2007/0071062 A1* 3/2007 Eisler et al. .................. 372/102
2007/0178615 A1* 8/2007 Banin et al. .................. 438/29

OTHER PUBLICATIONS

Margherita Zavelani-Rossi, et al., "Lasing in Self-Assembled Microcavities of CdSe/CdS Core/Shell Colloidal Quantum Rods", Nanoscale, 2010, pp. 931-935, vol. 2, The Royal Society of Chemistry.
Hydrophobic Nanocrystals Coated With an Amphiphilic Polymer Shell: A General Route to Water Soluble Nanocrystals, Teresa Pellegrino, et al., American Chemical Society, Mar. 26, 2004, Nano Letters, 2004, vol. 4, No. 4, 703-707.
Synthesis and Micrometer-Scale Assembly or Colloidal CdSe/CdS Nanorods Prepared by a Seeded Growth Approach; Nano Letters; 2007, vol. 7, No. 10, 2942-2950; American Chemical Society, Sep. 11, 2007.
Lasing from Semiconductor Quantum Rods in a Cylindrical Microcavity; Kazes; Advanced Materials; Oct. 29, 2011.
Quantization of Multiparticle Auger Rates in Semiconductor Quantum Dots; V.I. Klimov, et al.; Science 287, 1011 (2000); DOI: 10.1126/science.287.5455.1011.
Effect of Zero-to One-Dimensional Transportion on Multiparticle Auger Recombination in Semiconductor Quantum Rods; H. Htoon, et al.; Physical Review Letters; vol. 91, No. 22; week ending Nov. 28, 2003.
Single-exciton optical gain in semiconductor nanocrystals; Articles; Nature Publishing Group, 2007; Victor I. Klimov, et al.,; pp. 441-446.
Electroluminescence from single monolayers of nanocrystals in molecular organic devices; Letters to Nature; Oct. 2002.
Color-selective semiconductor nanocrystal laser, Applied Phsics Letters; vol. 80, No. 24, Jun. 17, 2002.

(Continued)

*Primary Examiner* — Dung Nguyen
(74) *Attorney, Agent, or Firm* — Sughrue Mion, PLLC

(57) ABSTRACT

A method of producing a lasing microsource of colloidal nanocrystals. The method includes the steps of preparing a nanocrystal solution in a solvent; depositing at least a drop of the nanocrystals solution with a drop volume below 1 nl on a flat substrate; and evaporating the solvent to dryness thereby to obtain at the edge of the evaporated drop a single annular stripe including a domain wherein the nanocrystals are arranged in an ordered array, wherein the ordered nanocrystals in the domain constitute an active region capable of lasing and the radially inner and outer edges of the stripe define a resonant cavity in which the active region is inserted.

13 Claims, 3 Drawing Sheets

OTHER PUBLICATIONS

Hybrid Organic—Nanocrystal Solar Cells, Delia J. Milliron, et al.; MRS Bulletin, vol. 30, Jan. 2005, pp. 41-44.

Multiparticle interactions and stimulated emission in chemically synthesized quantum dots; Mikhailovsky, et al., Applied Physics Letters, vol. 30k, No. 13, Apr. 1, 2002.

Room temperature optical gain in CdSe nanorod solutions, Stephan Link, et al. Journal of Applied Physics; vol. 92, No. 11; Dec. 1, 2002.

Ultrafast carrier dynamics in core and core/shell CdSe quantum rods: Role of the surface and interface defects; Arianna Creti, et al. Physical Review, B 72, 125346 (2005).

Absorption cross sections and Auger recombination lifetimes in inhered core shell nanocrys: Implications for lasing performance; J. Nanda, et al.; Journal of Applied Physics 99, 034309 (2006).

Light amplification in semiconductor nanocrystals: Quantum rods versus quantum dots; Applied Physics Letters;, vol. 82, No. 26, Jun. 30, 2003; H. Htoon , et al.

From amplified spontaneous emission to microring lasing using nanocrystal quantum dot solids; Applied Physics Letters; vol. 81, No. 7, Aug. 12, 2002; A. V. Malko, et al.

High-Performance, Quantum Dot Nanocomposites for Nonlinear Optical and Optical Gain Applications; Melissa A. Petruska, et al.; Advanced Materials; 2003, 15, No. 7-8, Apr. 17.

Whispering-Gallery-Mode Lasing from a Semiconductor Nanocrystal/Microsphere Resonator Composite; Preston T. Snee, et al.; Advanced Materials, Mar. 10, 2005.

Blue semiconductor nanocrystal laser; Applied Physics Letters; 86, 073102 (2005; Yinthai Chan, et al. Sep. 17, 2004.

Quantum Dot Microdrop Laser; J. Schafer, et al.; Nano Letters, 2008, vol. 8, No. 6, 1709-1712.

Multiexcitonic two-state lasing in a CdSe nanocrystal laser; Applied Physics Letters; Y. Chan, et al; Sep. 27, 2004, vol. 85, No. 13.

Soft-Lithographically Embossed, Multilayered Distributed-Feedback Nanocrystal Lasers; Vikram C. Sundar, et al.; Advanced Materials; 2004, 16, No. 23-24, Dec. 17.

Two-photon-pumped lasing from collidal nanocrystal quantum dots; Chungeng Zhang, et al.; Nov. 1, 2008; vol. 22, No. 21; Optics Letters.

Stimulated emission and lasing of random-growh oriented ZnO nanowires; Hsu-Cheng Hsu, et al.; Journal of applied Physics 97, 064315 (2005).

Lasing action in colloidal CdS/CdSe/CdS quantum wells, Jianfeng Xu and Min Xiao; Applied Physics Letters 87, 173117 (2005).

\* cited by examiner

FABRICATION OF LASING MICROCAVITIES CONSISTING OF HIGHLY LUMINESCENT COLLOIDAL NANOCRYSTALS

BACKGROUND OF THE INVENTION

The present invention relates to the production of lasing microdevices and specifically to self-assembled lasing microcavities consisting of highly luminescent nanocrystals.

Colloidal semiconductor nanocrystals have been exploited in electro-optical devices like light emitting diodes,[1] lasers[2,3] and solar cells. This trend is driven by the advanced synthesis of nanocrystals of various materials, sizes and shapes and will benefit from progress in their organization into ordered architectures by self-assembly. So far, lasing was difficult to achieve in nanocrystals because optical gain competed with Auger recombination above threshold, which shortened excited state lifetime to tens of picoseconds,[4] and laser feedback was possible only via external resonators.

The achievement of optical gain in colloidal semiconductor nanocrystals is challenging because two main obstacles have to be faced, namely trapping of excited carriers at surface/interface defect states[5] and Auger recombination. Trapping can be reduced effectively by growing a passivating shell of a higher band gap material around the emitting dot.[5] Auger recombination takes place in multiexciton regime and is highly efficient, with time constants ranging from a few picoseconds to a few hundreds of picoseconds.[4] One solution is to reduce the Auger process by working with semiconductor nanocrystals in which at least one spatial dimension is not in the strong confinement regime. Colloidal quantum rods (QRs) with a few nm in diameter offer the advantage of retaining the strong quantum confinement along two spatial directions, while their absorption cross section is significantly increased with respect to that of spherical QDs having similar optical features. As a result they show much longer gain lifetime than QDs[6] (up to nearly 100 ps), which can be increased further if the rods are coated with an epitaxial shell of suitable composition and thickness (150 ps being the longest gain lifetime reported so far[7]). Core-shell QRs thus represents the more promising solution towards lasing, provided that suitable ways to construct optical resonators become available.

So far, solely examples of lasers based on semiconductor nanocrystals have been reported,[2,8] in which an external resonator was adopted for generating the optical feedback (either a physical cavity or a feedback mechanism such as scattering in random lasing). In all these reported cases the QRs behaved therefore like dyes in conventional lasers. The need for an external resonator imposed several difficulties in matching the fabrication steps of wet chemical synthesis and deposition with the processes needed to fabricate the resonator.

US 2007/0178615 describes semiconductor nanocrystals-based optical devices and a method of preparing such devices. The optical device (e.g. the laser cavity) is formed by nanocrystal films on a surface which may be planar or not. The film is created by processing a nanorod solution with electromagnetic radiation, such as laser radiation or by coating techniques.

SUMMARY OF THE INVENTION

The present invention provides a method for producing a lasing microdevice, wherein the colloidal nanocrystals themselves form the resonating cavity needed for the laser feedback, which removes the necessity to fabricate an external resonator. Moreover, according to the invention, the resonator is formed by a self-assembly of the light emitting nanocrystals on a micrometer scale, which opens many possibilities for large scale production of such microlasers by economic jet deposition techniques.

The key discoveries related to this invention are that:
(i) the coffee stain effect for very small droplets (with nanoliter quantities of solution) leads to a single, well-defined ring-shaped nanocrystals deposit that has a very sharp border at its internal side; and
(ii) the dense deposit of the light emitting nanocrystals itself, wherein the nanocrystals are arranged in an ordered domain, can function as a resonator sufficient for laser feedback, wherein said domain constitutes the active region, while the radially inner and outer edges of the ring-shaped deposit can act as the semireflective means of the lasing microdevice.

The above-mentioned findings have been reported by the inventors of the present application in the paper entitled: "*Lasing in self-assembled micromvities of CdSe/CdS core/shell colloidal quantum rods*", authored by Margherita Zavelani-Rossi et al. and published in NanoScale, 2010, 2, 931-935, with on line publication on Feb. 5, 2010, which paper is incorporated herein by reference.

The subject matter of the invention is defined by the appended claims.

According to one aspect of the invention, a method for producing lasing microsources of colloidal nanocrystals is provided, which comprises the steps of:
  preparing a nanocrystal solution in a solvent;
  depositing on a flat substrate at least a drop of the nanocrystals solution with a nanoliter drop volume and preferably in a drop volume between 1 μl and 100 μl;
  evaporating the solvent to dryness thereby to obtain at the edge of the evaporated drop a single annular stripe or ring including at least a domain wherein said nanocrystals are arranged in an ordered array.

According to the invention, a lasing microsource is created by depositing a drop of a nanocrystals solution onto a flat substrate, preferably a glassy substrate, when the deposition is carried so as to obtain, upon evaporation of the solvent, a single, well-defined coffee stain ring with a sharp inner border. Said well-defined ring-shaped deposit can function as a resonant cavity for light emitted by the nanocrystals and acts as a lasing device under optical pumping. The well-defined ring-shaped deposit of the light emitting material constitutes at the same time the active material and the resonator.

In the method of the invention, the use of nanocrystals in the shape of nanorods is highly preferred. The term "nanorod" is meant to include a nanoparticle with extended growth along a first axis, while maintaining very small dimensions along the other two axis resulting in the growth of a rod-like shaped nanocrystal of a very small diameter in the range of about 1 nm to 10 nm, where the dimension along the first axis may range from about several nanometers to about 200 nm.

In the method of the invention, nanorods and particularly core-shell nanorods with the major dimension in the range of from 10 nm to 30 nm are preferred. However, the method of the invention for the fabrication of microlasers can be applied to any kind of highly luminescent colloidal nanocrystals, and is not restricted to the core-shell nanorods used for the prototype in the following experimental section.

The method is therefore applicable to any shape of nanocrystal (for example sphere, rod, platelet, branched structure) and to nanocrystals of various semiconductor materials, like CdS, CdSe, CdTe, ZnO, ZnSe, ZnTe, $FeS_2$, InP, InAs, GaAs, PbSe, PbS, HgTe, HgS, Si, Ge, CsPbX3 (X=Cl, Br, I) and their alloys, like for example $Zn_xCdS_{1-x}Se$, $CdS_xSe_{1-x}$, $ZnS_xSe_{1-x}$, $CuInS_2$. It can be applied to nanocrystals with a core-shell composition (i.e. core of a given semiconductor material and shell of a second semiconductor/insulating material).

It is also be applicable to multiple shell nanocrystals (i.e. nanocrystals with a core of a given semiconductor material and two or more shells of other semiconductor/insulating materials) like for example ZnS/CdSe/ZnS,CdSe/CdS/ZnS, CdS/HgS/CdS. The method is also applicable to doped nanocrystals, like Cu:ZnS, Mn:ZnS, CdS:Mn/ZnS, Ag:ZnS, Na:ZnO, Cu:ZnSe, Mn:ZnSe, Mn:ZnSe/ZnSe, Cr:ZnS, Cr:ZnSe, Cr:$Cd_{1-x}Mn_x$Te, Cr:CdSe, Fe:ZnSe, $ZrO_2$:Pr, $Gd_2O_3$:Eu, YAG:Eu, $NaYF_4$:Yb, $NaYF_4$:Er, $Y_2O_3$:Tb, ZnO: Er, $GdF_3$:Eu, CdS:O.

In the method of the invention any solvent, in which the luminescent nanocrystals are soluble (forming a colloidal solution), can be used; preferred are non-polar solvents, such as toluene. However, polar solvents and specifically water could also be used, for example using a capping technique, such as described in the article "*Hydrophobic nanocrystals coated with an amphiphilic polymer shell: a general route to water soluble nanocrystals*" by Teresa Pellegrino et al. in Nano Letters 2004, vol. 4, No. 4, 703-707, which is incorporated herein by reference.

The quoted article describes a general procedure allowing for transferring hydrophobically capped nanocrystals from organic to aqueous solutions by wrapping an amphiphilic polymer around the particles. In particular, high quality $CoPt_3$, Au, CdSe/ZnS and $Fe_2O_3$ nanocrystals have been water solubilized by the procedure. According to the procedure, a hydrophilic polymer shell is created around the nanocrystals by exploiting the non-specific hydrophobic interactions between the alkyl chains of poly(maleic anhydride alt-1-tetradecedene) and the nanocrystal surfactant molecules; addition of a cross-linking agent, namely bis(6-aminohexyl) amine, results in the cross-linking of the polymer chains around each nanoparticle. The nanocrystals become soluble in water upon hydrolyzation of the unreacted anhydride groups, which effectively leads to an amphiphilic polymer shell.

In the method of the invention, the only restriction relating to the solvent is the use of a solution having a high purity, free from any other organic or inorganic contaminants.

The nanocrystals are solubilized in the solvent, preferably in a molar concentration from $10^{-4}$ to $10^{-7}$ molar.

The drop deposition is preferably carried out by jet deposition with the use of a capillary having a diameter preferably of about 5 µm to 20 µm, on a previously cleaned glass substrate.

The diameter of the drops is preferably in the range of from 50 µm to 500 µm, with a preferred diameter of about 200 µm.

The evaporation of the drop deposit to dryness is preferably carried out at room temperature.

Specific embodiments of the invention are described in the following experimental section.

BRIEF DESCRIPTION OF THE DRAWINGS

In the annexed drawings:

FIG. 1(*b*) is a transmission electron microscope image of the nanorods;

FIG. 1(*c*) is a diagram showing the absorbance spectrum of the core-shell nanorods with a small peak due to the core absorption and a strong onset originating from absorption of the shell states;

FIGS. 2(*c-f*) are optical and scanning electron microscope images of a coffee stain ring obtained by the evaporation of a nanoliter droplet of nanorods dissolved in toluene at a concentration of $10^{-6}$ M; particularly, FIG. 2(*d-f*) show a section of the coffee stain ring at higher magnification;

FIG. 3(*b*) is a diagram showing the signal profile along the line shown in FIG. 3(*a*);

FIG. 3(*c*) is a schematic illustration of the pumping and detection geometry adopted in the following prototype experiments;

FIG. 3(*d*) illustrates the resonator formed by the densely packed assembly of nanorods;

FIG. 4(*b*) is a diagram showing the emission intensity as a function of the pump fluence;

DETAILED DESCRIPTION OF THE INVENTION

Experimental Section

Colloidal core-shell CdSe/CdS nanorods were obtained by the seeded growth method, published by L. Carbone et al. in Nano Letters, 2007, 7, 2942-2950. The obtained nanorods, which are soluble in toluene in a concentration of 1-3 exhibit both high fluorescent quantum yields (up to 70%) and linear polarized emission. The emission wavelength of the nanorods is in the range of 600-630 nm, but can in principle be controlled over a spectral window from 570 nm to 650 nm.

The nanorods were dissolved in toluene at a concentration of $10^{-6}$ M. The obtained solution was jet-deposited by means of a capillary with 20 µm diameter on a previously cleaned glass slide (cleaning by 20 min ultrasonic in acetone and 20 min ultrasonic in propanol, and low dry by nitrogen). The jet-deposition was performed using a Femtojet (Eppendorf) system combined with an inverted optical microscope. The capillary-glass slide distance was adjusted to some hundreds of microns, which corresponds to the drop diameter which is formed at the apex of the capillary. Preferably, the drop should touch the surface when it forms at the capillary tip. Since the volume of a picoliter drop is 4/3 pi $r^3$=1e-12, 1e-4 is a preferred sample capillary distance, in agreement with what we observed in the experiment. Typical jet deposition parameters were injection pressure at 1000 hPa for 1 second, with droplet volume in the picoliter range.

Injection pressure and time had to be adjusted for each deposition series, as they depended very critically on the glass-sample distance.

The drops can also be deposited on the substrate by means of an ink jet printer.

In the experiments, three samples of nanorods were used with a length, respectively, of 17, and 50 nm and a diameter of 3-5 nm. Each nanorod sample was nearly monodisperse in terms of distribution of rod length and diameter (size distribution n the nanocrystal samples was smaller than 10%). Once deposited on the glassy substrate and upon evaporation of the solvent (room temperature), it was observed that the nanorods start to self-organize into large-scale ordered superstructures that are reminiscent of nematic/smectic liquid crystal phases.

Figures 1A, 1B, 1C:
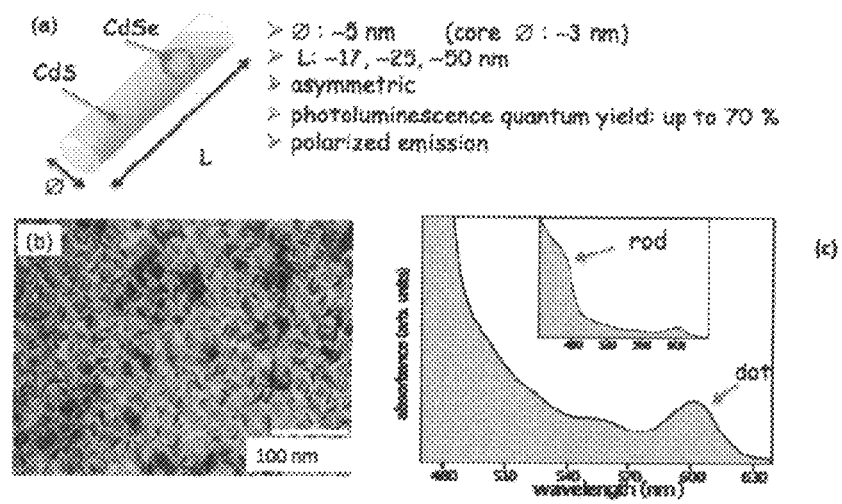
FIG. 1(*a*) is a schematic illustration of the asymmetric core-shell nanorods (CdSe/CdS), that constitutes the light emitting material used in the following experimental section.
Figures 2A, 2B, 2C, 2D, 2E, 2F:
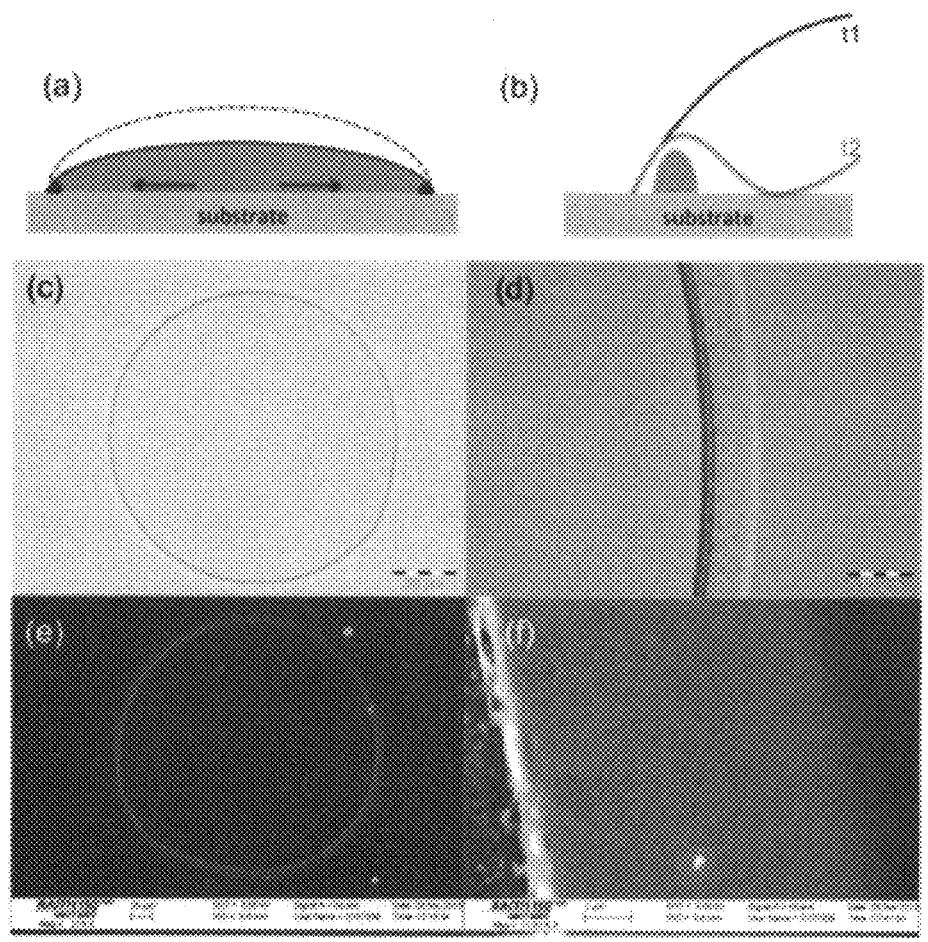
FIGS. 2(*a-b*) are schematic illustrations of the evaporation dynamics of the coffee stain effect; the pinning of the contact line of the evaporating droplet leads to a radially external flow of the liquid that transports the nanocrystals in the solution towards the contact line, where they form a dense ring-shaped deposit.

Due to the peculiar solvent evaporation in fluid convection dynamics usually referred to as the "coffee stain" effect, the whole process did not lead to uniform thickness of the nanoparticle film, but to a well-defined stripe (a single stripe) at the drop edge; this is due to the pinning of the contact line during solvent evaporation (cf. FIGS. 2($a$-$b$)).

The film thickness at the border of the dried droplet, i.e. in the outermost coffee stain ring, was between 30 nm and 90 nm, while the thickness immediately inside this ring was considerably smaller (~10 nm). The optical microscope images of the film (cf. e.g. FIGS. 2($c$-$f$)) show stripes at the border of the film that were darker than the inner region, which is due to higher concentration of the nanorods and higher film thickness in those stripes. In addition, the stripes were confined by two relatively sharp and dark lines, one at the inner edge and one at the outer edge of the border region.

According to the invention, the radial size of the stripes (i.e. the distance between the two dark lines) may range from 0.5 μm to 50 μm and is preferably comprised between 8 and 12 μm.

The stripes appeared birefringent when imaged by polarized optical microscopy. The anisotropy in the refractive index in the stripes can be explained by ordered arrays of laterally aligned close-packed nanorods; best lasing properties were found, when in said ordered array the main longitudinal axis of the nanorods are tangential to the circular annular stripe.

According to the invention it has been found that the dense self-assembled coffee stain ring, consisting of ordered nanorods, can form Fabry-Perot microresonators, in which sections of the annular stripe with two parallel planes partially reflecting the light give rise to interference.

Figures 3A, 3B, 3C, 3D:
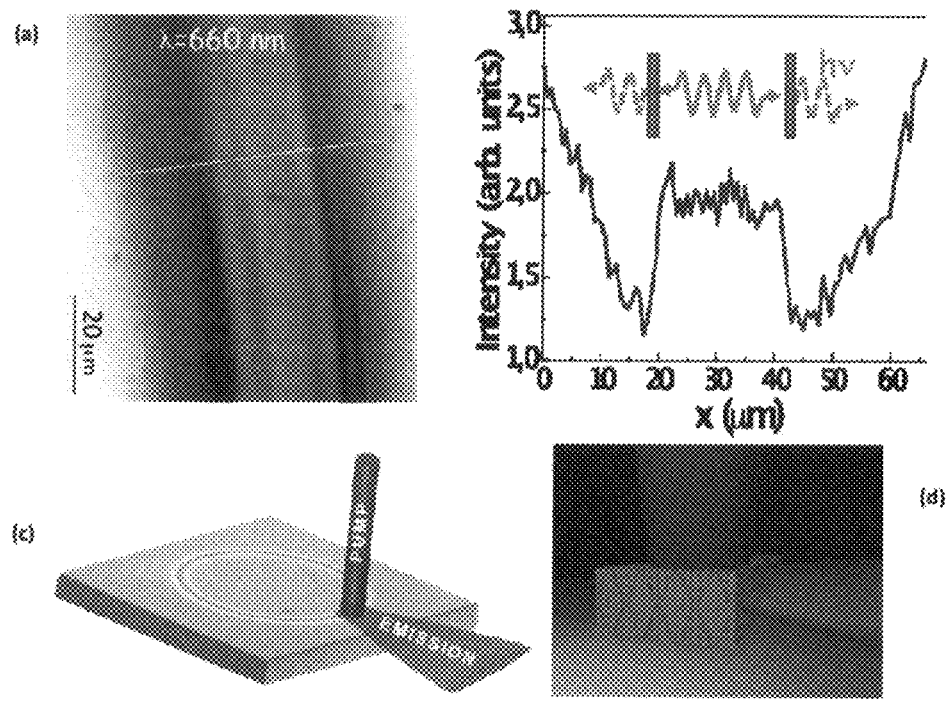
FIG. 3(*a*) is a reflectivity image obtained with a confocal microscope (incident light at 660 nm wavelength) of the upper border of the coffee stain ring.
Figures 4A, 4B:
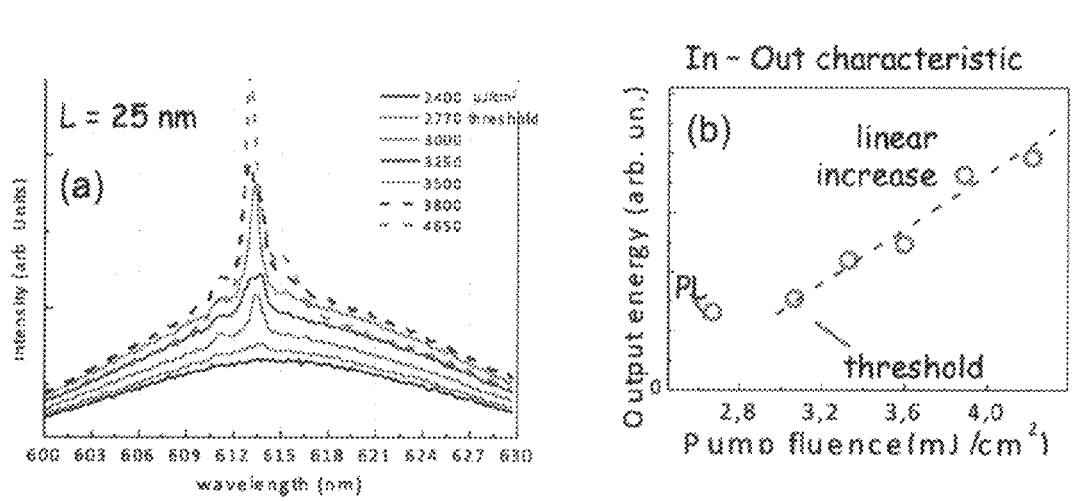
FIG. 4(*a*) shows the emission spectra from a Fabry-Perot self-assembled microcavity at the border of a drop made of quantum rods with 25 nm length, recorded at different pump fluences.
Figure 5:
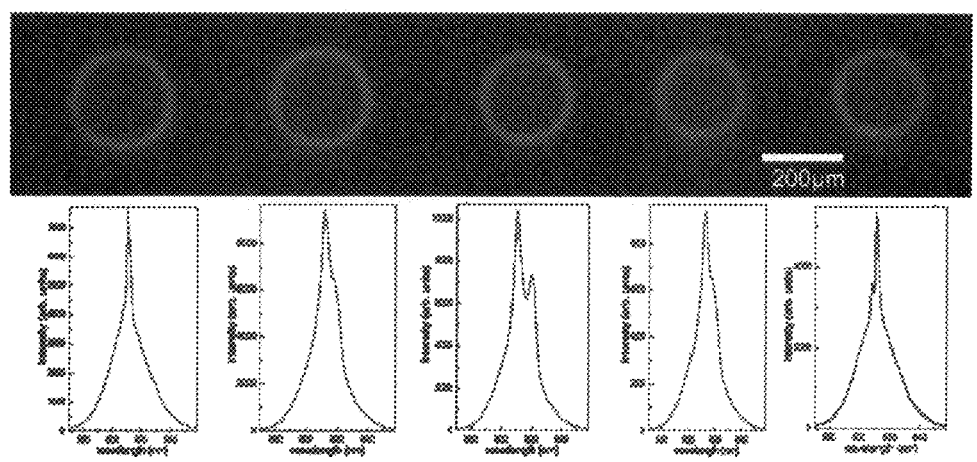
FIG. 5 shows fluorescent microscopy images of a row of coffee stains that all show lasing; the emission spectra at the onset threshold pump fluence for lasing are also shown. Lowest lasing threshold that was observed so far was 200 µJ/$cm^2$.

The confocal image (FIG. 3($a$)) provides deeper insight into the structure at the edges of the stripe; two dark edges limiting the stripes are clearly visible in the reflectivity image of the stripe region. The corresponding signal profile plotted in FIG. 3($b$) indicates a strong and abrupt change of the reflectivity at the edges of the stripe, which occurred on a length scale of less than 1 μm. This rapid change in reflectivity, and thus also in the refractive index, is most likely responsible for the confinement of light inside the stripes and consequently for the Fabry-Perot effect, that was observed also in the ASE spectra. The Fabry-Perot effect was observed more frequently on stripes prepared from nanorods 17 nm and 25 nm long and only occasionally on coffee stain fringes formed from nanorods with a 50 nm length, whereby nanorods with a length of from 10 nm to 30 nm are preferred in the method of the invention.

The shape of the self assembled laser cavity is determined by the shape of contact line that is formed when the nanocrystal solution is deposited on the substrate surface. In the case of no lateral alterations of the substrate this shape is circular and the result of the coffee stain evaporation is an annular ring.

The shape of the coffee stain rings can be manipulated to a certain extent via modifications of the substrate surface or shape. It is important for the lasing functionality that the modifications do not alter significantly the microfluidic dynamics in the coffee stain evaporation process.

Figure 6:
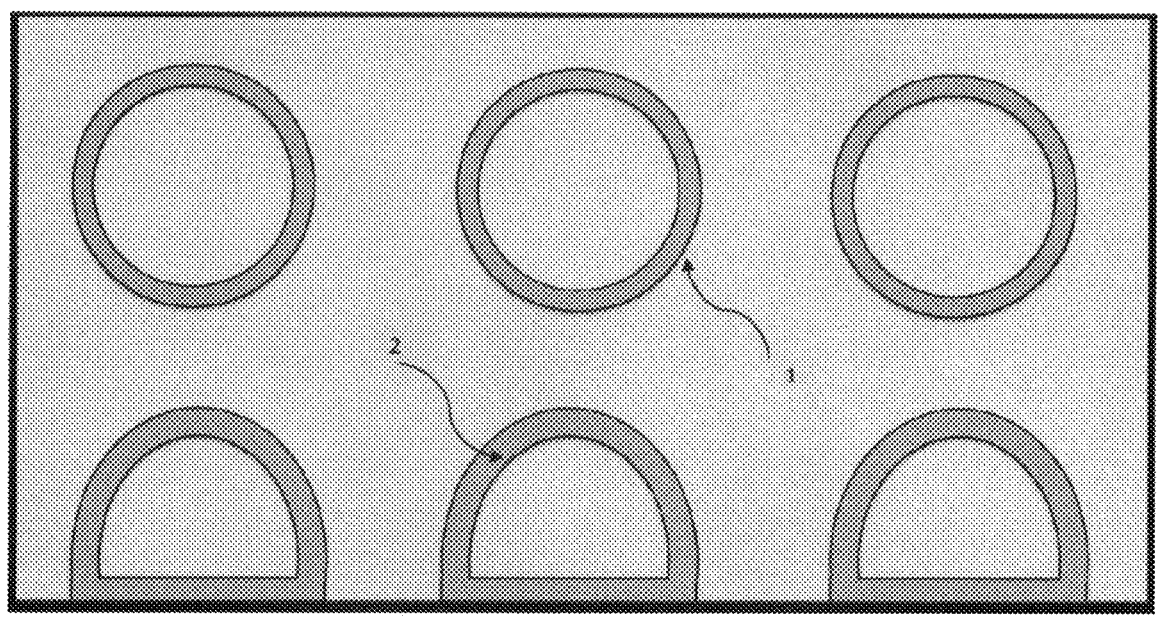
FIG. 6 is a schematic representation of lasing microcavities, including circular microcavities 1 and microcavities 2 having a linear straight side obtained by depositing the nanocrystals solution near a linear edge of the substrate.

Since the contact line pinning is enhanced at the edges of a substrate, the shape of the coffee stain can be manipulated via the borders of the substrate, or via artificial edges (holes in the substrate, large vertical offsets). For example, linear sections of the coffee stain edge can be obtained in a simple way by depositing the nanocrystal solution near the linear edge of a, preferably glassy, substrate, as illustrated in FIG. 6. This could be the external edge of the substrate, or edges that are produced for example by rectangular holes. Instead of holes, also high step-like features produced for example by reactive ion etching could be used.

Another possibility is the manipulation of the contact line via different surface hydrophobic/hydrophilic functionalization, for example via adequate molecules.

In the experiments, the threshold for lasing with respect to the pump power was of the order of few hundreds μJ/cm² (best value 200 μJ/cm²).

The optical experiments probing the lasing properties were performed using a Ti:sapphire chirped pulse amplified source that delivers pulses at a central wavelength of 800 nm with a 1 kHz repetition rate. Excitation pulses at 400 nm were obtained by doubling the fundamental wavelength in a β-barium borate (BBO) crystal.

Technical Parameters:
  focusing lens: 300 mm
  spot size (radius): 120 μm
  pump beam at 45° to the sample, collection normal to the sample
  spectrograph Acton, grating 300 g/mm, centered at 610 nm, slit, 26 μm, resolution 1.1 nm, acquisition time 500 ms.

With the core-shell nanorods used in the experiments, the spectral range of the laser emission can be tuned in the visible range by the nanorod core size and rod-shape in the range from 550 nm to 650 nm; additional experiments showed also lasing from the shell states of the core-shell nanorods which extends the spectral range for the laser device of the invention into the blue to 490 nm.

Also included within the scope of the invention is a lasing microdevice obtainable by the hereinbefore described method. In the microdevice of the invention, the active region, which can emit photons at optical frequencies, is an ordered array of nanocrystal and particularly an ordered array of laterally aligned close-packed nanorods and the semireflective means defining the resonant optical structure in which the said active region is inserted comprise the radially inner and outer edges of an annular, circular, stripe formed by said nanocrystals and obtained by evaporating to dryness a circular drop of a nanocrystal solution.

In the microdevice of the invention, the excitation system can comprise a pumping laser focusing on the sector of the annular stripe formed by said ordered array of nanocrystals or, alternatively, a pumping laser illuminating the entire area of said annular stripes.

Also included within the scope of the invention is a light emitting microdevice or lasing microsource comprising a plurality of said annular stripes on a flat substrate, wherein the said annular stripes are obtained by the method hereinbefore described.

REFERENCES

1. S. Coe, W. K. Woo, M. Bawendi, V. Bulovic, *Nature* 2002, 420.800-803.

2. M. Kazes, D. Y. Lewis, Y. Ebenstein, T. Mokari, U. Banin, *Adv. Mater.* 2002, 14. 317-+.
3. H. J. Eisler, V. C. Sundar, M. G. Bawendi, M. Walsh, H. I. Smith, V. Klimov, *Appl. Phys. Lett.* 2002, 80. 4614-4616.
4. V. I. Klimov, A. A. Mikhailovsky, D. W. McBranch, C. A. Leatherdale, M. G. Bawendi, *Science* 2000, 287. 1011-1013.
5. A. A. Mikhailovsky, A. V. Malko, J. A. Hollingsworth, M. G. Bawendi, V. I. Klimov, *Appl. Phys. Lett.* 2002, 80. 2380-2382; S. Link, M. A. El-Sayed, *J. Appl. Phys.* 2002, 92. 6799-6803; A. Creti, M. Anni, M. Z. Rossi, G. Lanzani, G. Leo, F. Della Sala, L. Manna, M. Lomascolo, *Phys. Rev. B* 2005, 72. 25346.
6. H. Htoon, J. A. Hollingsworth, R. Dickerson, V. I. Klimov, *Physical Review Letters* 2003, 91. art. n. 227401.
7. A. Creti, M. Zavelani-Rossi, G. Lanzani, M. Anni, L. Manna, M. Lomascolo, *Phys. Rev. B* 2006, 73. 16541.
8. A. V. Malko, A. A. Mikhailovsky, M. A. Petruska, J. A. Hollingsworth, H. Htoon, M. G. Bawendi, V. I. Klimov, *Appl. Phys. Lett.* 2002, 81. 1303-1305; M. A. Petruska, A. V. Malko, P. M. Voyles, V. I. Klimov, *Adv. Mater.* 2003, 15. 610-613; P. T. Snee, Y. H. Chan, D. G. Nocera, M. G. Bawendi, *Adv. Mater.* 2005, 17. 1131-1136; Y. Chan, J. S. Steckel, P. T. Snee, J. M. Caruge, J. M. Hodgkiss, D. G. Nocera, M. G. Bawendi, *Appl. Phys. Lett.* 2005, 86. 073102; J. Schafer, J. P. Mondia, R. Sharma, Z. H. Lu, A. S. Susha, A. L. Rogach, L. J. Wang, *Nano Lett.* 2008, 8. 1709-1712; Y. Chan, J. M. Caruge, P. T. Snee, M. G. Bawendi, *Appl. Phys. Lett.* 2004, 85. 2460-2462; C. Zhang, F. Zhang, T. Zhu, A. Cheng, J. Xu, Q. Zhang, S. E. Mohney, R. H. Henderson, Y. A. Wang, *Optics Letters* 2008, 33. 2437-2439.

The invention claimed is:

1. A method of producing a lasing microsource of colloidal nanocrystals, comprising the steps of:
    preparing a nanocrystal solution in a solvent,
    depositing at least a drop of said nanocrystals solution with a drop volume below 1 nl on a flat substrate,
    evaporating the solvent to dryness thereby to obtain at the edge of the evaporated drop a single annular stripe including at least a domain wherein said nanocrystals are arranged in an ordered array, wherein the ordered nanocrystals in said at least one domain constitute an active region capable of lasing and the radially inner and outer edges of said stripe define a resonant cavity in which said active region is inserted.

2. A method according to claim 1, wherein the nanocrystals are made of semiconductor material selected from the group consisting of CdS, CdSe, CdTe, ZnO, ZnSe, ZnTe, $FeS_2$, InP, InAs, GaAs, PbSe, PbS, HgTe, HgS, Si, Ge, $CsPbX_3$, wherein X is selected from Cl, Br and I and their alloys.

3. A method according to claim 1, wherein said nanocrystals are core-shell nanorods.

4. A method according to claim 1, wherein the nanocrystal are core-shell nanorods selected from the group consisting of CdSe/CdS, CdSe/ZnS, CdSe/ZnSe, $ZnO/(CdOH)_2$, ZnSe/ZnS, CdS/ZnS, InP/ZnS, InAs/CdS, InAs/CdSe, InAs/ZnSe, CdTe/CdS, CdTe/ZnTe, HgTe/CdS, $Zn_xCd_{1-x}Se/C$, $CuInS_2$/ZnS, $Si/SiO_2$.

5. A method according to claim 1, wherein the nanocrystals solution is deposited as a drop having a volume of from 1 μl to 100 μl (picoliter).

6. A method according to claim 1, wherein said nanocrystals solution has a nanocrystal molar concentration of from $10^{-4}$ to $10^{-7}$ M.

7. A method according to claim 1, wherein the solvent is a non-polar solvent.

8. A method according to claim 1, wherein said nanocrystals are nanorods, having a length from 10 nm to 30 nm.

9. A method according to claim 1, wherein the radial dimension of said annular stripe is from 0.5 μm to 50 μm.

10. A method according to claim 1, wherein said at least a drop is deposited on said substrate by means of an ink jet printer device.

11. A method for generating laser emissions from a laser microsource, comprising the step of subjecting to optical pumping a laser microsource as obtained by the method according to claim 1.

12. A lasing microdevice or microsource as obtained by the method according to claim 1.

13. A lasing microdevice comprising an active region and semireflecting means defining a resonant optical structure in which the said active region is inserted, wherein said active region consists of an ordered array of nanocrystals obtained by:
    preparing a nanocrystal solution in a solvent,
    depositing at least a drop of the nanocrystals solution on a flat substrate, and
    evaporating the solvent to dryness thereby to obtain at the edge of the evaporated drop a single annular stripe including at least a domain wherein said nanocrystals are arranged in an ordered array, said domain constituting said active region and wherein the semireflective means comprise the inner and outer edges of said annular stripe.

* * * * *

UNITED STATES PATENT AND TRADEMARK OFFICE
CERTIFICATE OF CORRECTION

PATENT NO. : 8,259,772 B2  
APPLICATION NO. : 13/021221  
DATED : September 4, 2012  
INVENTOR(S) : Roman Krahne et al.

Page 1 of 1

It is certified that error appears in the above-identified patent and that said Letters Patent is hereby corrected as shown below:

On the Title Page: Item (73) Assignee: delete "Fondazione Istituto Italiano di Technologia" and insert -- Fondazione Istituto Italiano di Tecnologia --

Signed and Sealed this  
Twenty-fifth Day of February, 2014

Michelle K. Lee  
*Deputy Director of the United States Patent and Trademark Office*